(12) United States Patent
Wu et al.

(10) Patent No.: US 11,603,846 B2
(45) Date of Patent: Mar. 14, 2023

(54) PUMP MECHANISM, PUMP SYSTEM, AND MANUFACTURING METHOD OF PUMP MECHANISM

(71) Applicant: Delta Electronics, Inc., Taoyuan (TW)

(72) Inventors: Wei-Fang Wu, Taoyuan (TW); Chia-Ying Hsu, Taoyuan (TW); Chia-Yu Yeh, Taoyuan (TW); Chi-Chang Teng, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 296 days.

(21) Appl. No.: 16/927,378

(22) Filed: Jul. 13, 2020

(65) Prior Publication Data

US 2021/0025397 A1 Jan. 28, 2021

Related U.S. Application Data

(60) Provisional application No. 62/878,576, filed on Jul. 25, 2019.

(30) Foreign Application Priority Data

Sep. 19, 2019 (CN) .......................... 201910886114.3

(51) Int. Cl.
*G01F 1/20* (2006.01)
*F04D 29/54* (2006.01)
(Continued)

(52) U.S. Cl.
CPC ........... *F04D 13/06* (2013.01); *F04D 29/548* (2013.01); *G01F 1/20* (2013.01); *H05K 5/03* (2013.01);
(Continued)

(58) Field of Classification Search
CPC .......... G01F 1/20; F04D 29/558; F04D 29/548
See application file for complete search history.

(56) References Cited

U.S. PATENT DOCUMENTS

| | | | | |
|---|---|---|---|---|
| 2009/0040714 A1* | 2/2009 | Yamada | ............ | H05K 7/20172 361/679.48 |
| 2011/0064561 A1* | 3/2011 | Huang | .................. | F04D 25/166 415/60 |

(Continued)

FOREIGN PATENT DOCUMENTS

| CN | 101144482 A | 3/2008 |
|---|---|---|
| CN | 204187069 U | 3/2015 |

(Continued)

OTHER PUBLICATIONS

Office Action dated Nov. 29, 2021 in CN Application No. 201910886115.3, 11 pages.

(Continued)

*Primary Examiner* — Hung V Ngo
(74) *Attorney, Agent, or Firm* — Muncy, Geissler, Olds & Lowe, P.C.

(57) ABSTRACT

A pump mechanism is provided, including a housing, a first impeller, a second impeller, and two driving modules. The housing includes a first recess, a second recess, a plate, a channel, an input pipe, a first output pipe, and a second output pipe. The plate is disposed between the first recess and the second recess. The channel passes through the plate and communicated with the first recess and the second recess. The input pipe is connected to the channel and passes through the housing and the plate. The first output pipe and the second output pipe are respectively communicated with the first recess and the second recess.

18 Claims, 13 Drawing Sheets

(51) Int. Cl.
  *F04D 13/06* (2006.01)
  *H05K 7/14* (2006.01)
  *H05K 5/03* (2006.01)
  *H05K 7/20* (2006.01)

(52) U.S. Cl.
  CPC ....... *H05K 7/1427* (2013.01); *H05K 7/20272* (2013.01)

(56) References Cited

U.S. PATENT DOCUMENTS

| | | | | |
|---|---|---|---|---|
| 2011/0079374 | A1* | 4/2011 | Horng | H05K 7/20172 165/121 |
| 2011/0150651 | A1* | 6/2011 | Zha | F04D 29/424 416/120 |
| 2013/0120935 | A1* | 5/2013 | Huang | G06F 1/20 361/695 |
| 2016/0298653 | A1* | 10/2016 | Masuo | F04D 19/002 |
| 2017/0009773 | A1 | 1/2017 | Marenco et al. | |
| 2017/0212560 | A1* | 7/2017 | Tsai | H05K 7/20272 |
| 2018/0087512 | A1* | 3/2018 | Darley | F04D 1/006 |
| 2019/0187763 | A1* | 6/2019 | Chen | F04D 1/06 |

FOREIGN PATENT DOCUMENTS

| | | |
|---|---|---|
| CN | 107013467 A | 8/2017 |
| CN | 109923315 A | 6/2019 |
| TW | M-562420 U | 6/2018 |

OTHER PUBLICATIONS

Office Action dated Sep. 2, 2021 in CN Application No. 202010507282.X, 7 pages.
Office Action dated Jan. 5, 2022 in CN Application No. 202010516700.1, 7 pages.

* cited by examiner

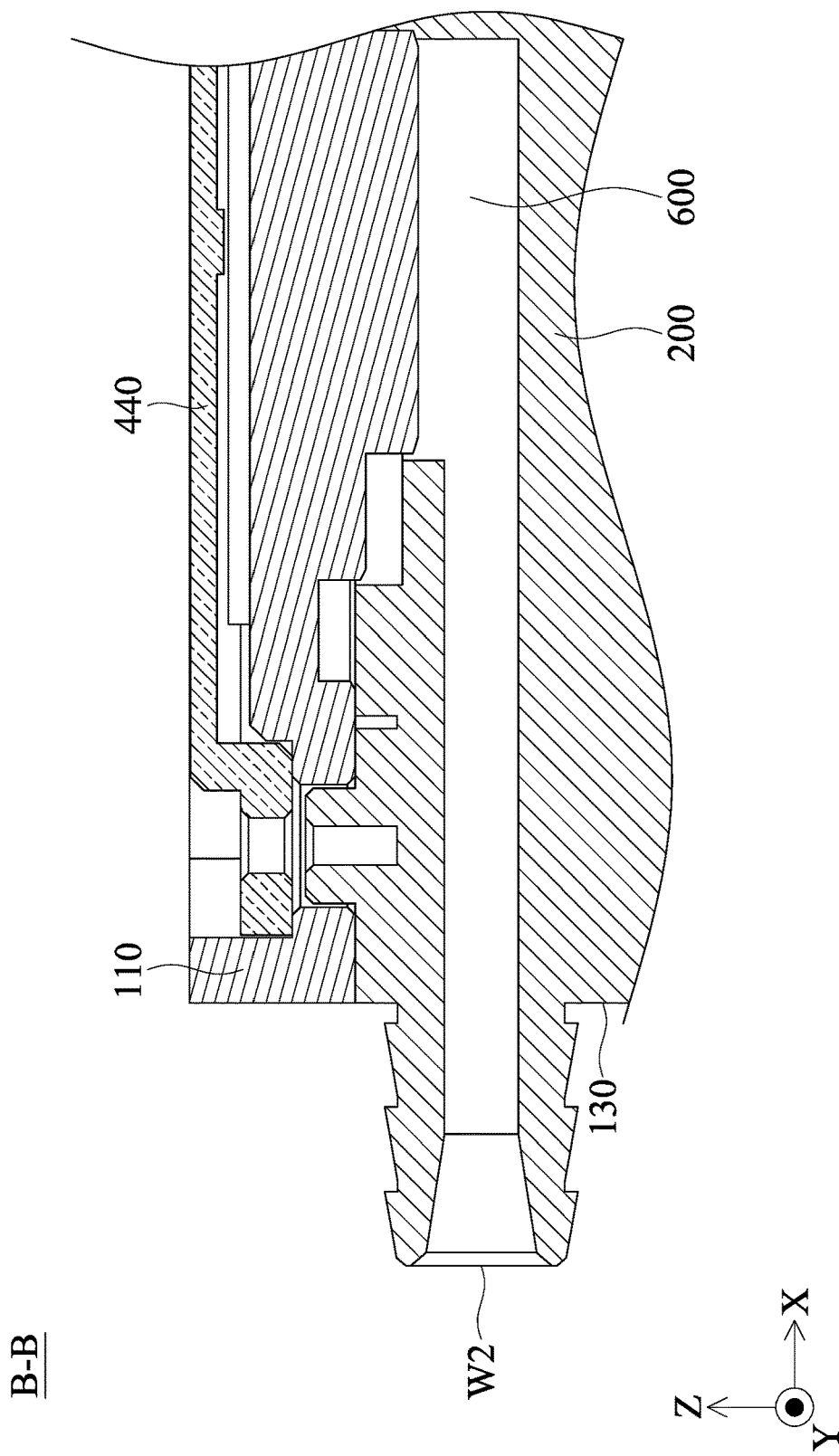

PUMP MECHANISM, PUMP SYSTEM, AND MANUFACTURING METHOD OF PUMP MECHANISM

CROSS REFERENCE TO RELATED APPLICATIONS

This application claims the benefit of U.S. Provisional Application No. 62/878,576, filed on Jul. 25, 2019, and China Patent Application No. 201910886114.3, filed Sep. 19, 2019, the entirety of which are incorporated by reference herein.

BACKGROUND OF THE INVENTION

Field of the Invention

The application relates in general to a pump mechanism, and in particular, to a pump mechanism having two or more outlets.

Description of the Related Art

In general, an electronic device such as a server or a personal computer generates a large amount of heat during operation. For example, the heat may be generated by the controller, the processor, the memory, the chipset, the hard disk, and/or the interface cards. If the heat cannot be effectively dispersed, the performance of the electronic device will suffer, and the electronic device may stop operating.

Some electronic devices use water cooling to dissipate heat. However, when there are multiple targets with heat that needs to be dissipated, multiple pumps are required to push the liquid. Connection and assembly is inconvenient, and it is hard to miniaturize the electronic device. Therefore, how to address the aforementioned problem has become an important issue.

BRIEF SUMMARY OF INVENTION

To address the deficiencies of conventional products, an embodiment of the invention provides a pump mechanism, including a housing, a first impeller, a second impeller, and two driving modules. The housing includes a first recess, a second recess, a plate, a channel, an input pipe, a first output pipe, and a second output pipe. The plate is disposed between the first recess and the second recess. The channel passes through the plate and communicated with the first recess and the second recess. The input pipe is connected to the channel and passes through the housing and the plate. The first output pipe and the second output pipe are respectively communicated with the first recess and the second recess. In the operation, the liquid enters the pump mechanism via the input pipe, and flow into the first recess and the second recess via the channel. Two driving modules can respectively drive the first impeller and the second impeller to rotate, and the liquid in the first recess and the second recess can respectively leave the pump mechanism via the first output pipe and the second output pipe.

An embodiment of the invention also provides a pump system, including the aforementioned pump mechanism, a first tube, a second tube, and a first electronic member. The first tube and the second tube are respectively connected to the first output pipe and the second output pipe, and the first electronic member contacts the first tube.

An embodiment of the invention further provides a manufacturing method of the pump mechanism. The manufacturing method includes: providing a pump main body, wherein the pump main body has a first recess, a second recess, a channel, an input pipe, a first output pipe, and a second output pipe, the channel is communicated with the first recess and the second recess, the input pipe is communicated with the channel, and the first output pipe and the second output pipe are respectively communicated with the first recess and the second recess; providing a first cover; providing a second cover; disposing a first impeller and a second impeller in the first recess and the second recess respectively; engaging the first cover with the pump main body and covering the first recess to form a first space; and engaging the first cover with the pump main body and covering the first recess to form a second space.

BRIEF DESCRIPTION OF DRAWINGS

The invention can be more fully understood by reading the subsequent detailed description and examples with references made to the accompanying drawings, wherein:

FIG. 4B is a cross-sectional view along line B-A in FIG. 1;

DETAILED DESCRIPTION OF INVENTION

The making and using of the embodiments of the pump mechanism are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
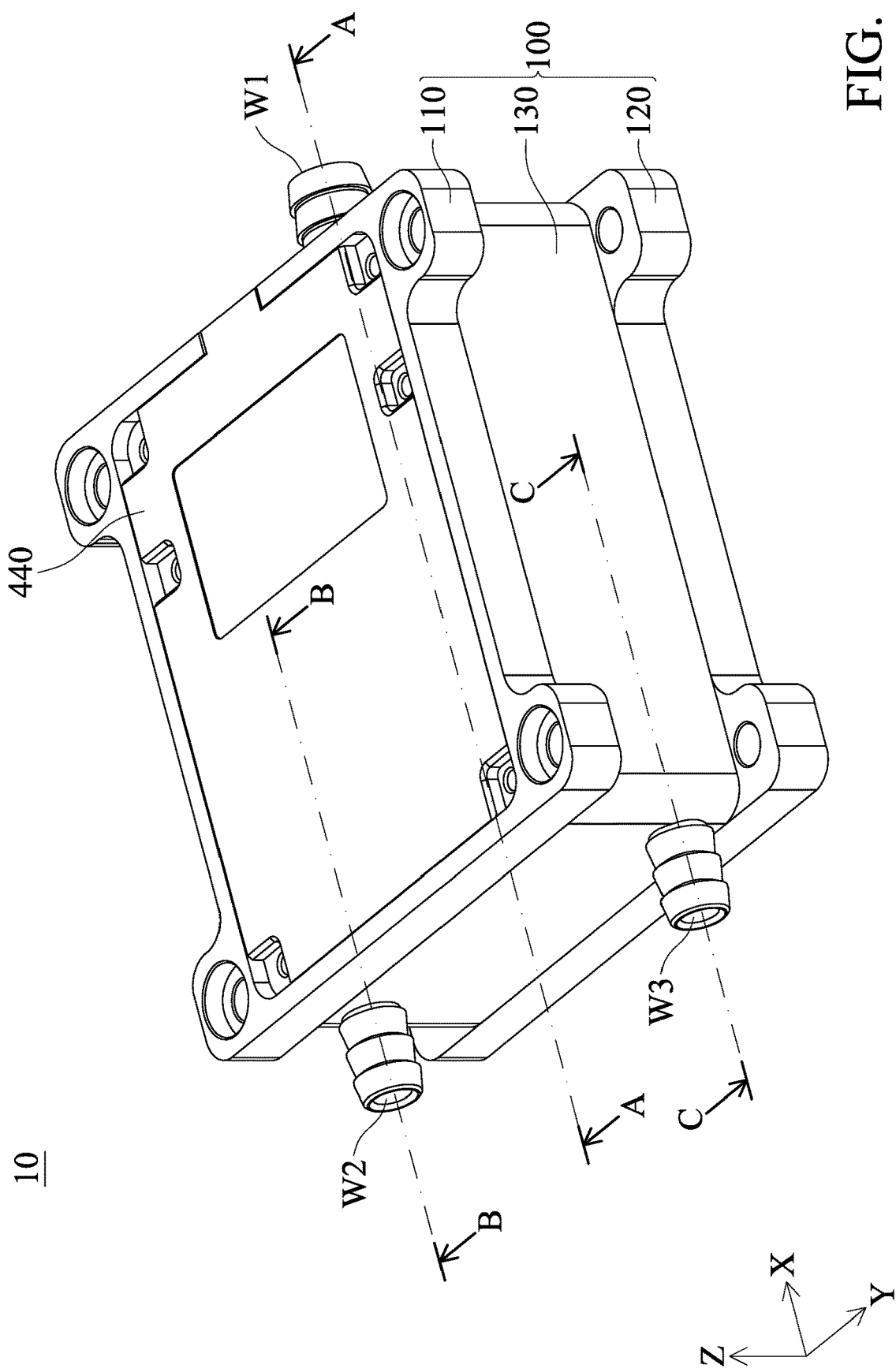
FIG. 1 is a schematic diagram of a pump mechanism according to an embodiment of the invention.
Figure 2:
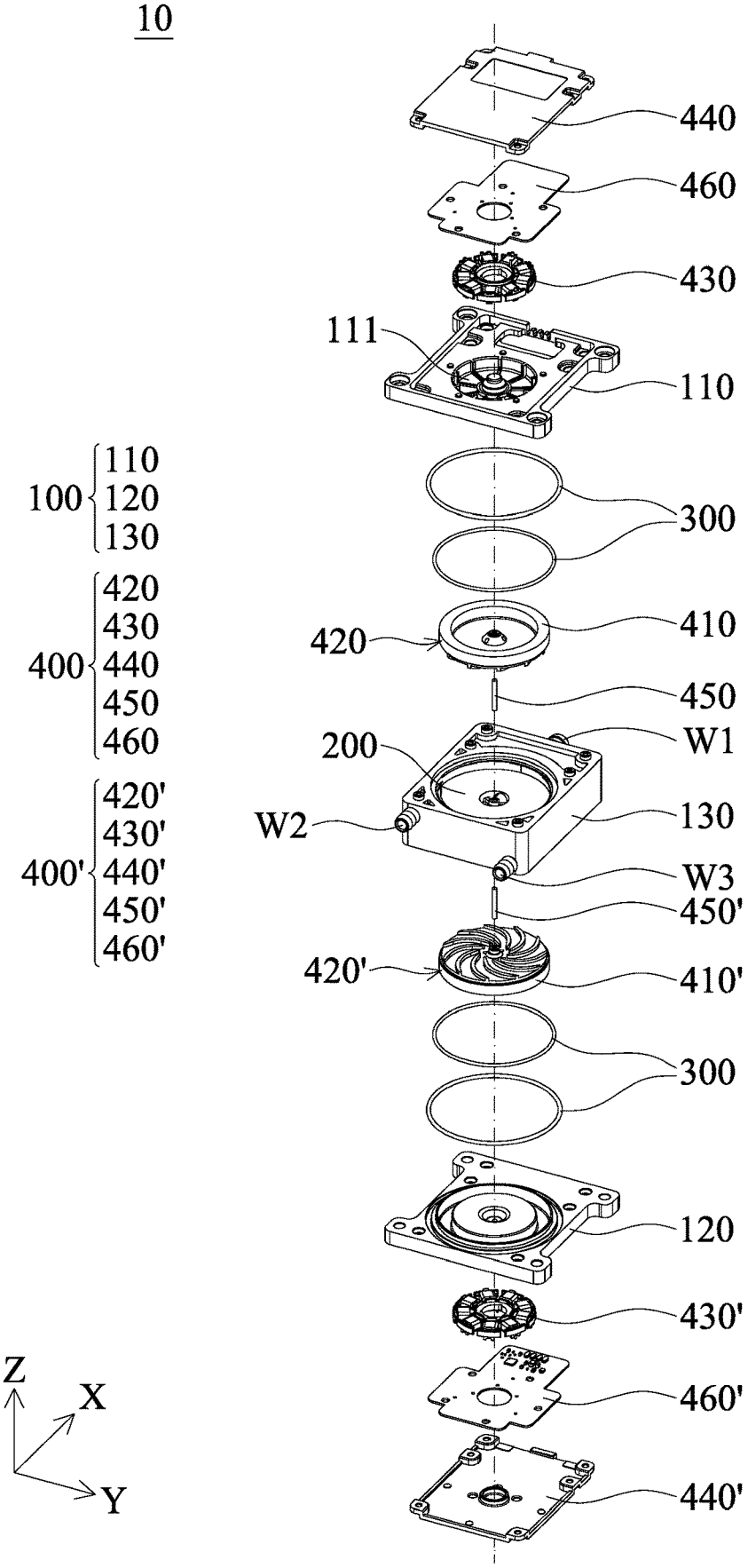
FIG. 2 is an exploded-view diagram of the pump mechanism according to an embodiment of the invention.
Figure 3A:
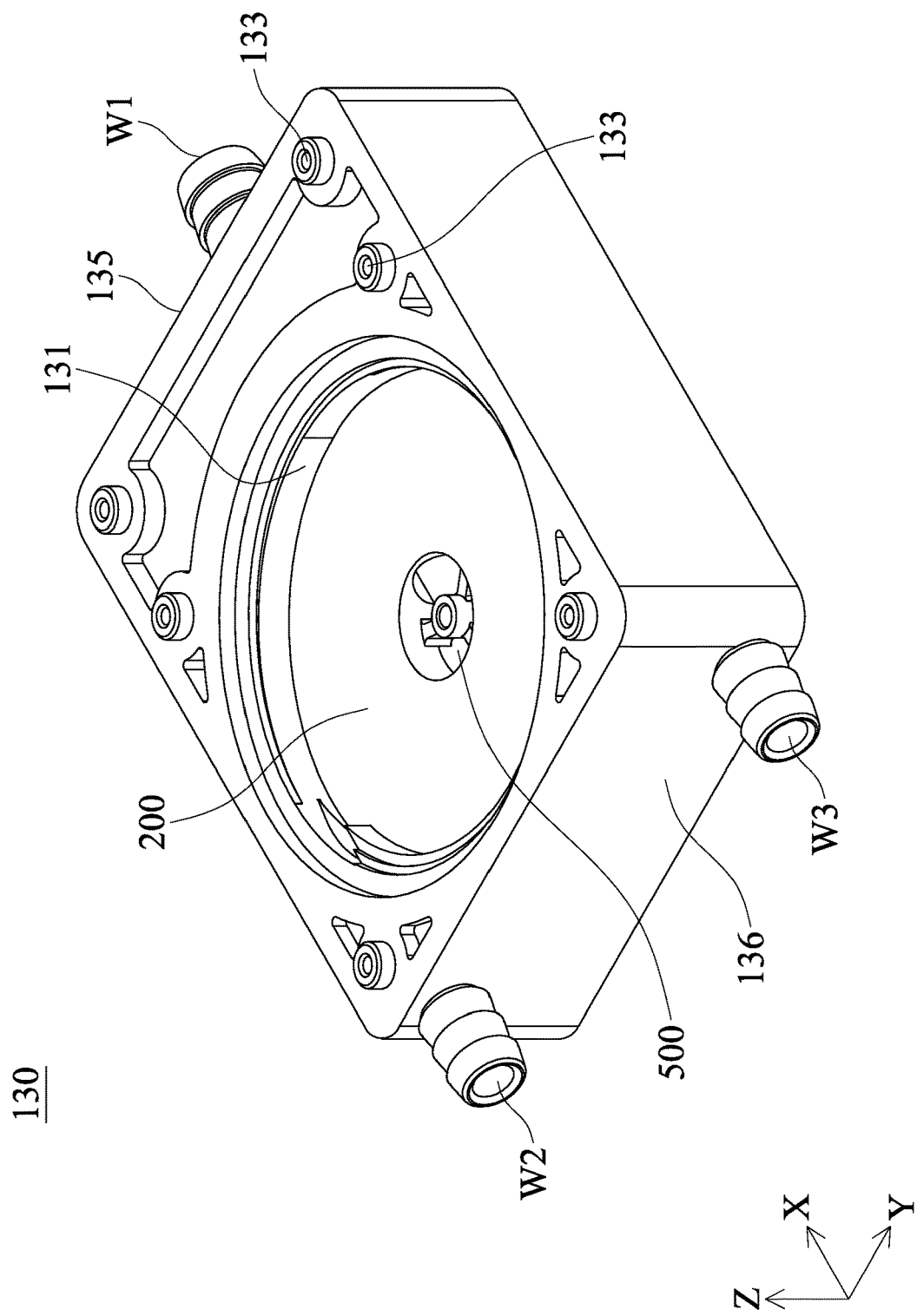
FIG. 3A is a schematic diagram of a pump main body according to an embodiment of the invention.
Figure 3B:
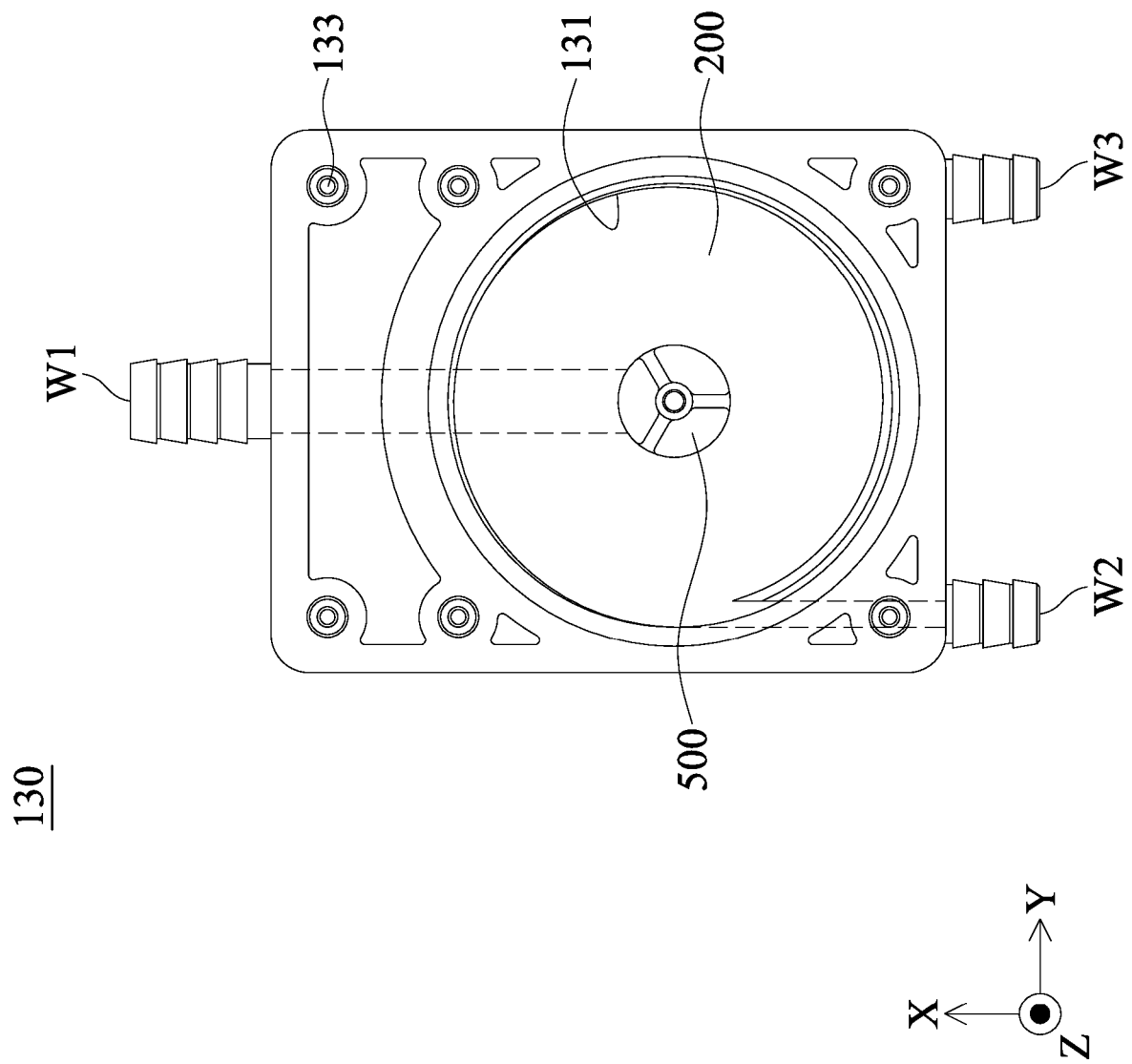
FIG. 3B is a top view of the pump main body according to an embodiment of the invention.
Figure 3C:
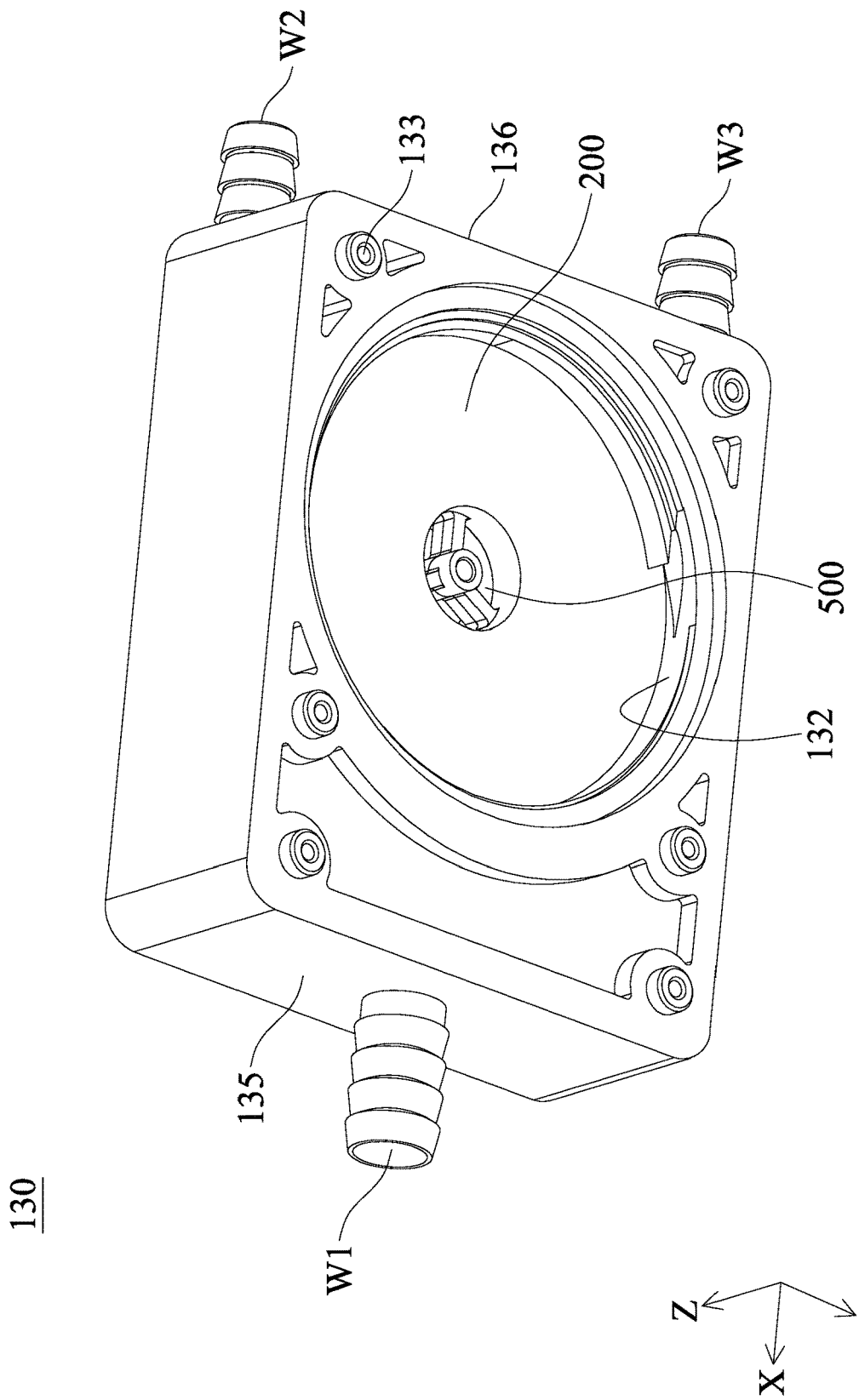
FIG. 3C is a schematic diagram of the pump main body in another view according to an embodiment of the invention.
Figure 3D:
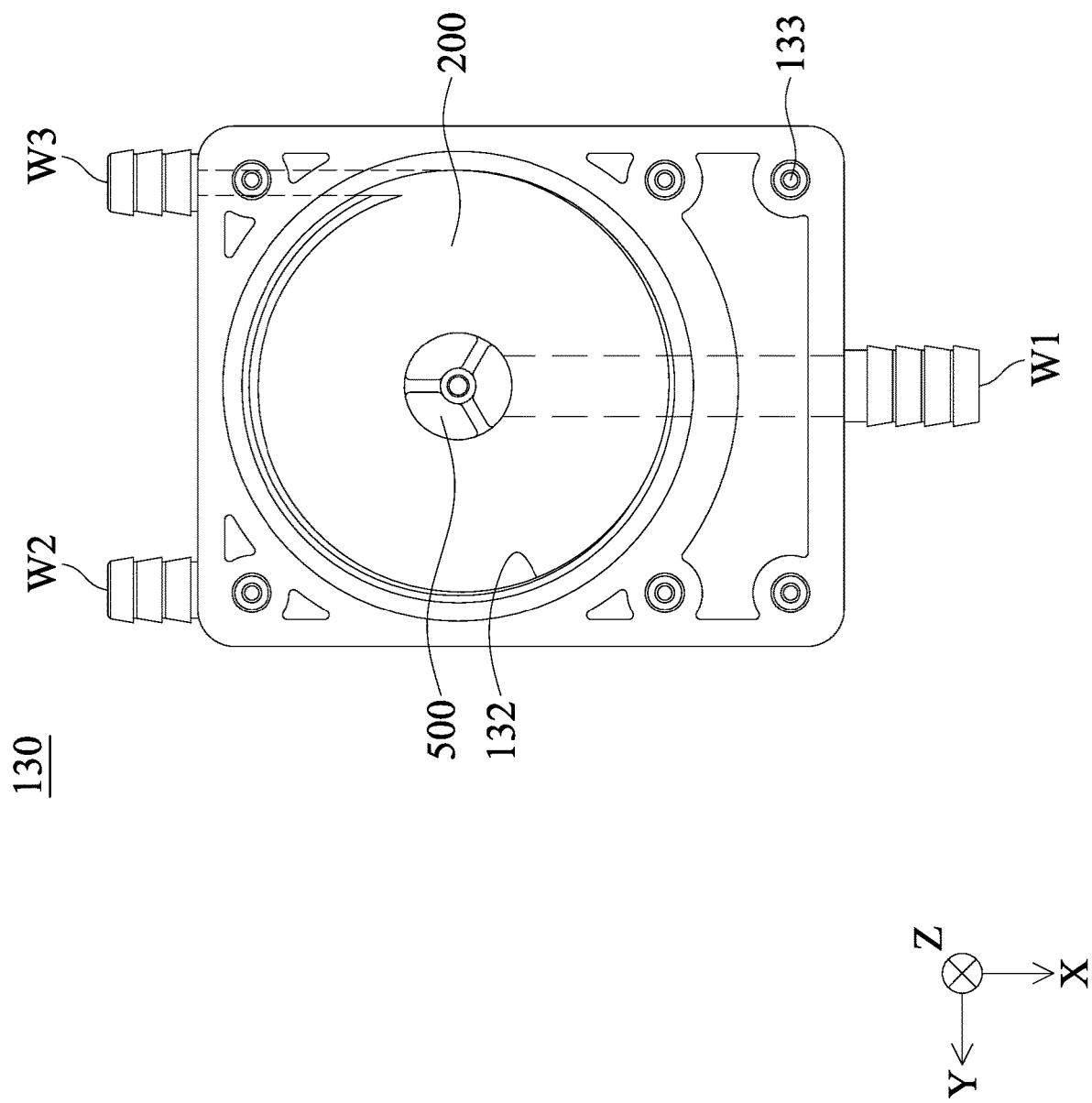
FIG. 3D is a bottom view of the pump main body according to an embodiment of the invention.

FIG. 1 is a schematic diagram of a pump mechanism 10 according to an embodiment of the invention, and FIG. 2 is an exploded-view diagram of the pump mechanism 10. As shown in FIGS. 1 and 2, the pump mechanism 10 primarily includes a housing 100, a plurality of O-rings 300, two driving modules 400 and 400', a first impeller 410, and a second impeller 410'. The housing 100 includes a first cover 110, a second cover 120, and a pump main body 130.

Referring to FIGS. 3A-3D, the pump main body 130 includes a first recess 131, a second recess 132, an input pipe W1, a first output pipe W2, a second output pipe W3, and a plate 200. The plate 200 is disposed between the first recess 131 and the second recess 132. A channel 500 that communicates with the first recess 131 and the second recess 132 is formed on the plate 200.

The input pipe W1 is disposed on a lateral wall 135 of the pump main body 130, and connected to the channel 500 by passing through the pump main body 130 and the plate 200. The first output pipe W2 and the second output pipe W3 are disposed on another lateral wall 136 of the pump main body 130, and respectively communicated with the first recess 131 and the second recess 132.

In this embodiment, both the first recess 131 and the second recess 132 have circular cross-sections, and the dimensions of the cross-section of the first recess 131 are substantially the same as that of the second recess 132. The channel 500 is disposed in the center of the circular cross-section. The first output pipe W2 and the second output pipe W3 are extended along the tangent line of the circular cross-section. Furthermore, the lateral wall 135 and the lateral wall 136 are disposed on the opposite sides of the pump main body 130.

It should be noted that, the positions of the first output pipe W2 and the second output pipe W3 can be adjusted as required, and are not limited to the disclosed embodiment. For example, in some embodiments, the lateral wall 136 where the first and second output pipes W2 and W3 disposed on is adjacent to the lateral wall 135, where the input pipe W1 disposed on. In some embodiments, the first output pipe W2 and the second output pipe W3 are disposed on the different lateral walls.

Figure 4A:
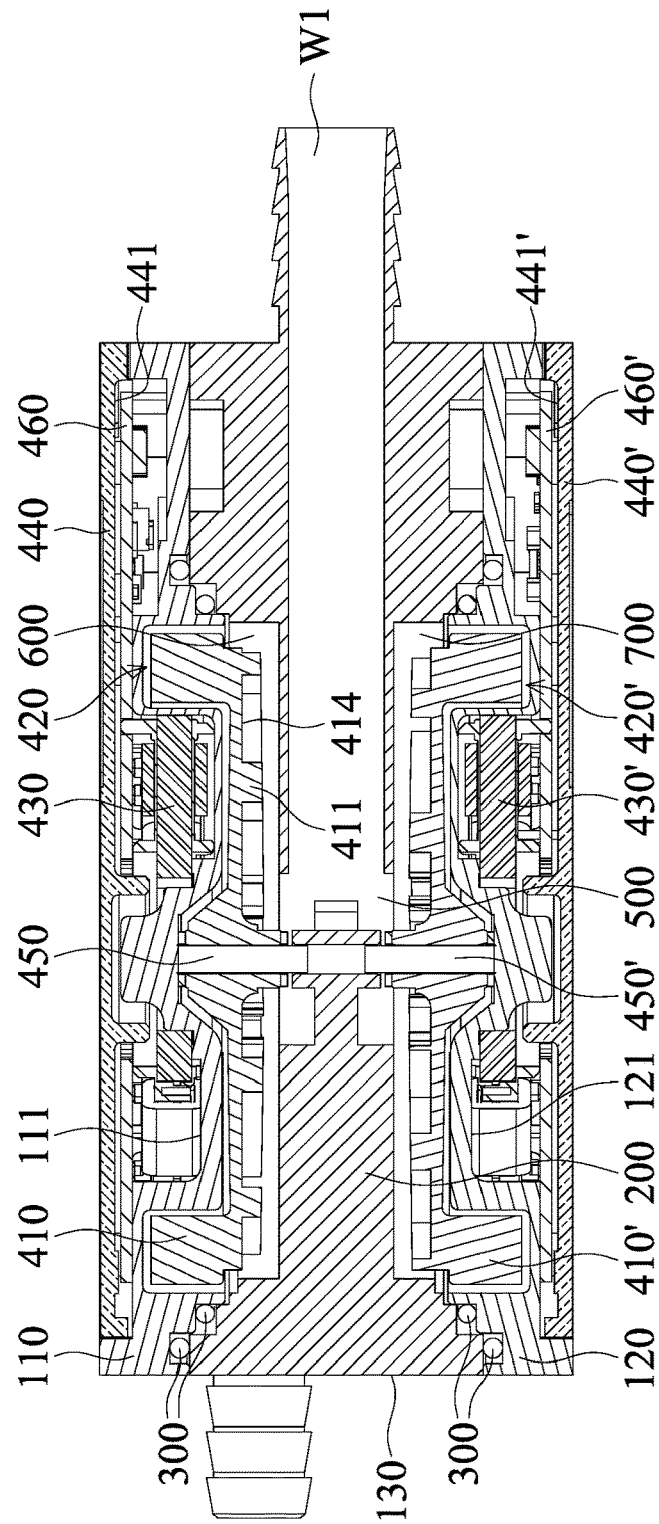
FIG. 4A is a cross-sectional view along line A-A in FIG. 1.
Figure 4C:
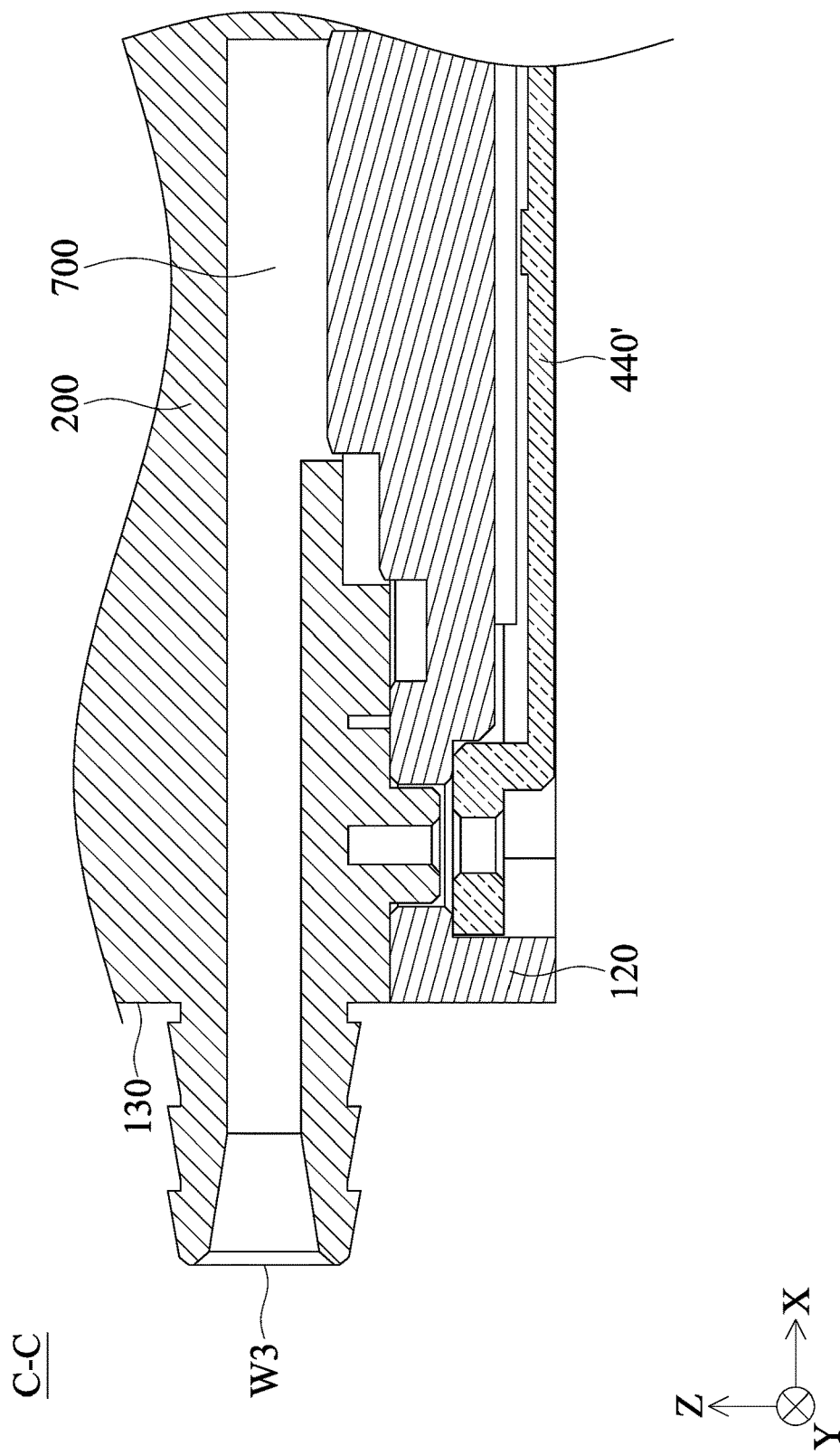
FIG. 4C is a cross-sectional view along line C-C in FIG. 1.

In this embodiment, the pump main body 130 further includes a plurality of protrusions 133, disposed on the surface forming the first recess 131 and the second recess 132. The protrusions 133 are configured to connect the first cover 110 and the second cover 120. As shown in FIGS. 4A-4C, when the pump main body 130, the first cover 110, and the second cover 120 are assembled, the first cover 110 covers the first recess 131 to form a first space 600, and the second cover 120 covers the second recess 132 to form a second space 700. The first space 600 and the second space 700 are respectively communicated with the first output pipe W2 and the second output pipe W3. At least one O-ring 300 is disposed between the first cover 110 and the pump main body 130, and at least one O-ring 300 is disposed between the second cover 120 and the pump main body 130, so as to prevent the liquid in the pump mechanism 10 from leaking.

Referring to FIGS. 1-4A, the driving module 400 includes a magnetic ring 420, a stator winding 430, a base 440, a shaft 450, and a circuit board 460. The driving module 400' includes a magnetic ring 420', a stator winding 430', a base 440', a shaft 450', and a circuit board 460'.

The first impeller 410 is disposed in the first space 600/the first recess 131, and pivotally connected to the pump main body 130 via the shaft 450. The magnetic ring 420 is disposed on the first impeller 410. The stator winding 430 is connected to the circuit board 460. The first cover 110 is disposed between the first impeller 410 and the driving module 400. In particular, a depression portion 111 is formed on the first cover 110, wherein at least a portion of the depression portion 111 enters the first space 600, and the stator winding 430 is accommodated in the depression portion 111. The base 440 covers the depression portion 111, and an accommodating portion 441 is formed on a side of the base 440. The electronic components of the circuit board 460 can be accommodated in the accommodating portion 441. For example, the electronic components of the circuit board 460 include the wires, the capacitances, and/or the resistances.

According to the magnetic ring 420 and the stator winding 430, the first impeller 410 can be driven to rotate relative to the housing 100. In this embodiment, the magnetic ring 420 can be a magnet, the stator winding 430 can be a coil, and the circuit board 460 can be a printed circuit board (PCB) or a flexible printed circuit (FPC). When the current flows through the coil (the stator winding 430), the electromagnetic effect generated between the coil and the magnet can provide a driving force to drive the first impeller 410 to rotate relative to the housing 100.

Similarly, the second impeller 410' is disposed in the second space 700/the second recess 132, and pivotally connected to the pump main body 130 via the shaft 450'. The magnetic ring 420' is disposed on the second impeller 410'. The stator winding 430' is connected to the circuit board 460'. The second cover 120 is disposed between the second impeller 410' and the driving module 400'. In particular, a depression portion 121 is formed on the second cover 120, wherein at least a portion of the depression portion 121 enters the second space 700, and the stator winding 430' is accommodated in the depression portion 121. The base 440' covers the depression portion 121, and an accommodating portion 441' is formed on a side of the base 440'. The electronic components of the circuit board 460' can be accommodated in the accommodating portion 441'. For example, the electronic components of the circuit board 460' include the wires, the capacitances, and/or the resistances.

According to the magnetic ring 420' and the stator winding 430', the second impeller 410' can be driven to rotate relative to the housing 100. In this embodiment, the magnetic ring 420' can be a magnet, the stator winding 430' can be a coil, and the circuit board 460' can be a printed circuit board (PCB) or a flexible printed circuit (FPC). When the current flows through the coil (the stator winding 430'), the electromagnetic effect generated between the coil and the magnet can provide a driving force to drive the second impeller 410' to rotate relative to the housing 100.

In this embodiment, the second impeller 410' and the first impeller 410 are arranged in opposite directions, and preferably rotate around the same rotation axis. As observed from the top of the pump mechanism 10 (FIG. 3B), the first impeller 410 rotates counterclockwise, and the second impeller 410' rotates clockwise. In other words, the first impeller 410 and the second impeller 410' rotate in different directions.

Since the coils (the stator windings 430 and 430') and the circuit boards 460 and 460' are not disposed in the first space 600 and the second space 700, the short circuit in contact with liquid can be avoided.

Figure 5A:
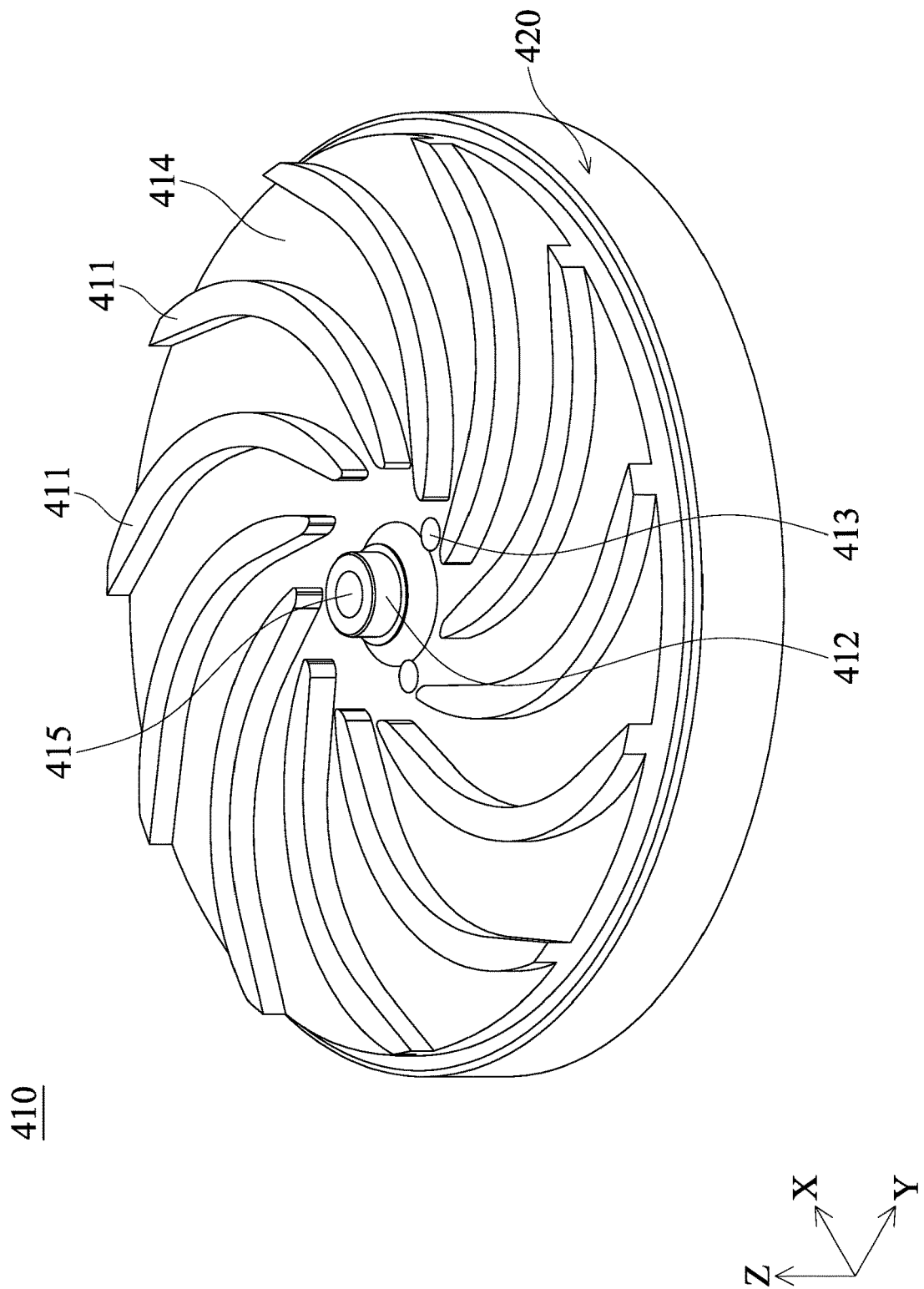
FIG. 5A is a schematic diagram of a first impeller according to an embodiment of the invention.
Figure 5B:
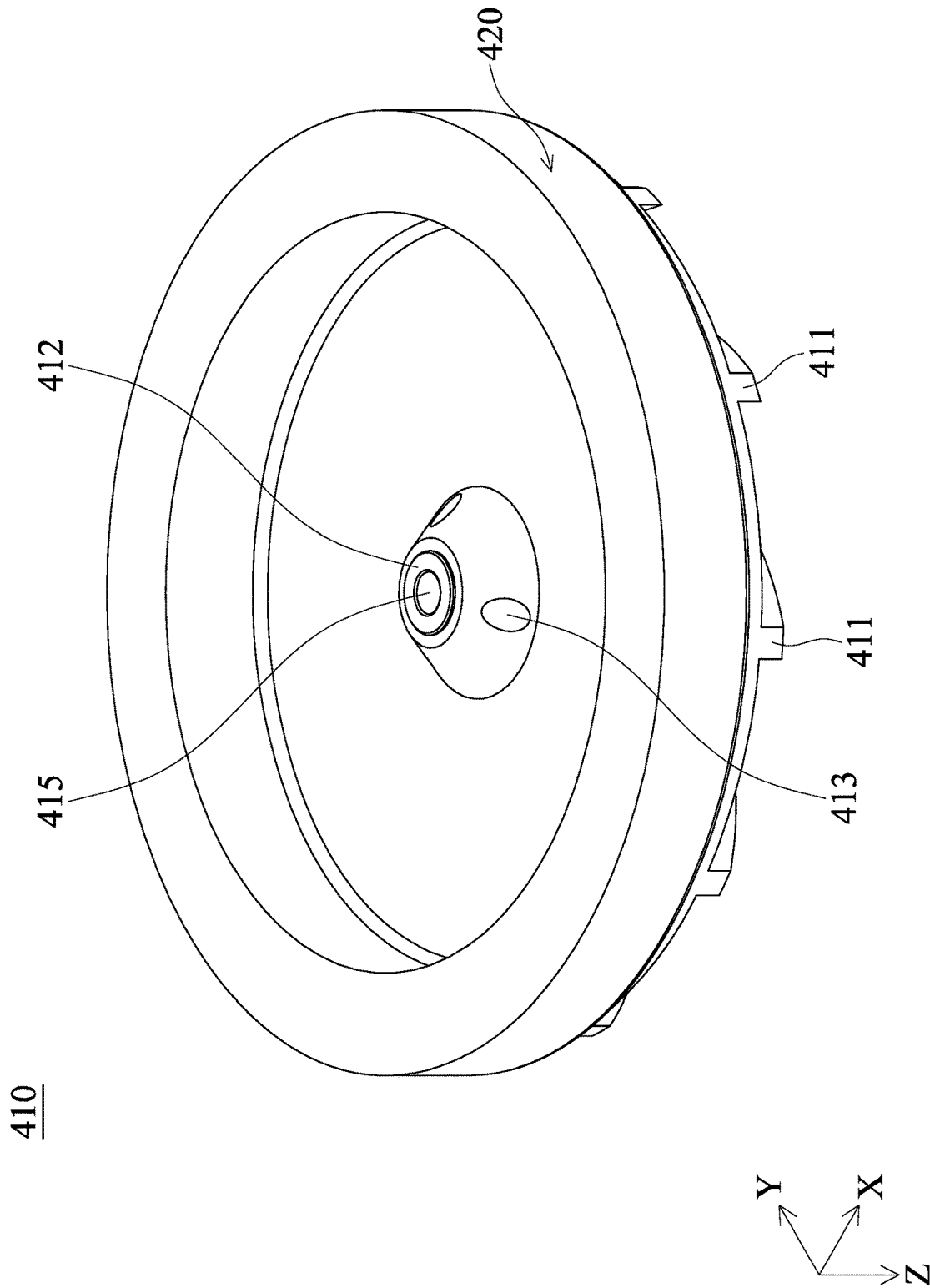
FIG. 5B is a schematic diagram of the first impeller in another view according to an embodiment of the invention.

Referring to FIGS. 4A, 5A and 5B, the first impeller 410 has a plurality of blades 411, a bearing 412, and a plurality of balance holes 413. The blades 411 are formed on a surface 414 of the first impeller 410 facing the plate 200. The bearing 412 is disposed in the center of the first impeller 410, and a shaft hole 415 of the bearing 412 is configured to connect the shaft 450. The balance hole 413 is arranged on the periphery of the shaft hole 412 at equal intervals.

It should be noted that, in this embodiment, the magnetic ring 420 is formed by magnetizing the lateral side of the first impeller 410. Therefore, the first impeller 410 and the magnetic ring 420 in this embodiment are integrally formed as one piece. Furthermore, the structure of the second impeller 410' is the same as the structure of the first impeller 410, so that the features thereof are not repeated in the interest of brevity.

The manufacturing method of the pump mechanism 10 is discussed below. Referring to the FIGS. 1-5B, first, the first cover 110, the second cover 120, and the pump main body 130 can be provided. Second, the stator winding 430, the circuit board 460 and the base 440 can be disposed on the first cover 110, the stator winding 430', the circuit board 460' and the base 440' can be disposed on the second cover 120, and the first impeller 410 and the second impeller 410' can be pivotally connected to the pump main body 130 of the opposite side of the pump main body 130. The first impeller 410 and the second impeller 410' are respectively accommodated in the first recess 131 and the second recess 132.

Finally, the first cover 110 can be engaged with the pump main body 130 and cover the first recess 131 to form the first space 600, and the second cover 120 can be engaged with the pump main body 130 and cover the second recess 132 to form the second space 700. It should be noted that, when the first and second covers 110 and 120 are engaged with the pump main body 130, the O-rings 300 can be disposed between the first cover 110 and the pump main body 130, and between the second cover 120 and the pump main body 130, so as to fill the gap between the members and prevent the liquid from leaking. The pump mechanism 10 can be assembled in the aforementioned steps.

Figure 6:
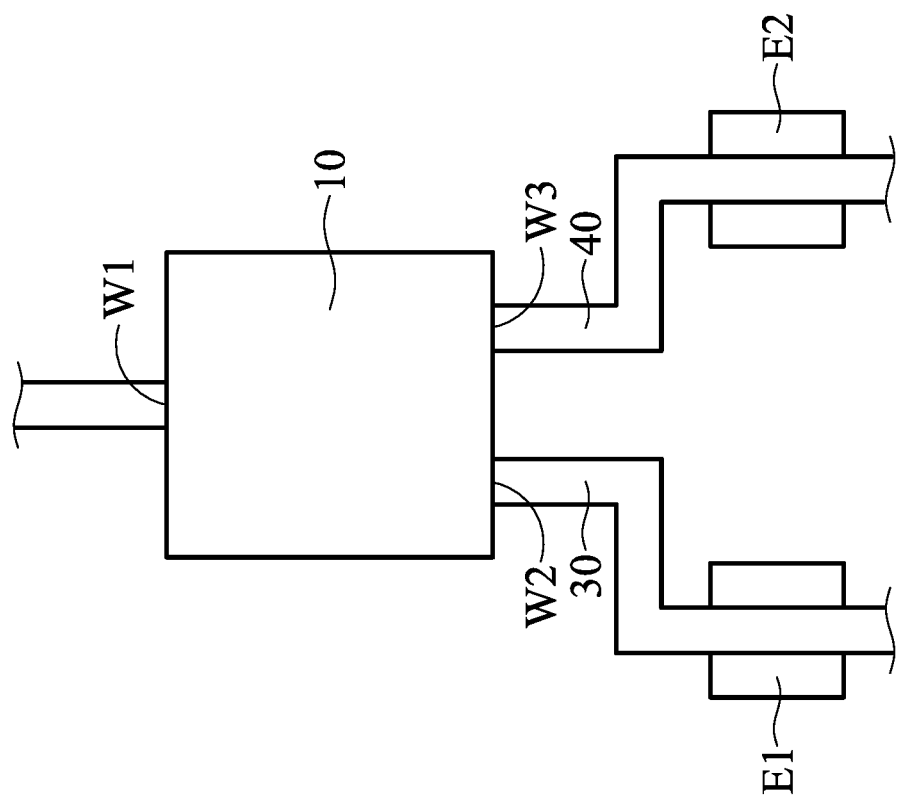
FIG. 6 is a schematic diagram of a pump system according to an embodiment of the invention.

Referring to FIG. 6, the pump mechanism 10 can be used in a pump system E. The pump system E includes the aforementioned pump mechanism 10, a first tube 30, a second tube 40, a first electronic member E1, and a second electronic member E2.

The first output pipe W2 and the second output pipe W3 of the pump mechanism 10 are respectively connected to the first tube 10 and the second tube 40. The first tube 30 and the second tube 40 can respectively contact the first electronic member E1 and the second electronic member E2.

In the operation, the liquid (such as water or oil) can enter the pump mechanism 10 via the input pipe W1, and flow into the first space 600 and the second space 700 via the channel 500. Subsequently, the driving modules 400 and 400' respectively drive the first impeller 410 and the second impeller 410' to rotate, and the liquid in the first space 600 and the second space 700 can respectively leave the pump mechanism 10 via the first output pipe W2 and the second output pipe W3. The liquid leaving from the first output pipe W2 flows into the first tube 30. Since the first tube 30 contacts the first electronic member E1, the heat generated by the first electronic member E1 can transmit to the liquid in the first tube 30, and heat dissipation efficiency can be enhanced. Similarly, the liquid leaving from the second output pipe W3 flows into the second tube 40. Since the second tube 40 contacts the second electronic member E2, the heat generated by the second electronic member E2 can transmit to the liquid in the second tube 40, and heat dissipation efficiency can be enhanced.

For example, the first electronic member E1 and the second electronic member E2 can include a central processing unit (CPU), a graphics processing unit (GPU), a hard disk, and/or a memory.

In some embodiments, the first tube 30 and the second tube 40 can contact the same electronic member (such as the first electronic member E1). During normal operation, only the driving module 400 operates to drive the liquid to flow through the first tube 30. When the first tube 30 is obstructed or has failed, the driving module 400' is activated and drives the liquid to flow through the second tube 40.

Figure 7:
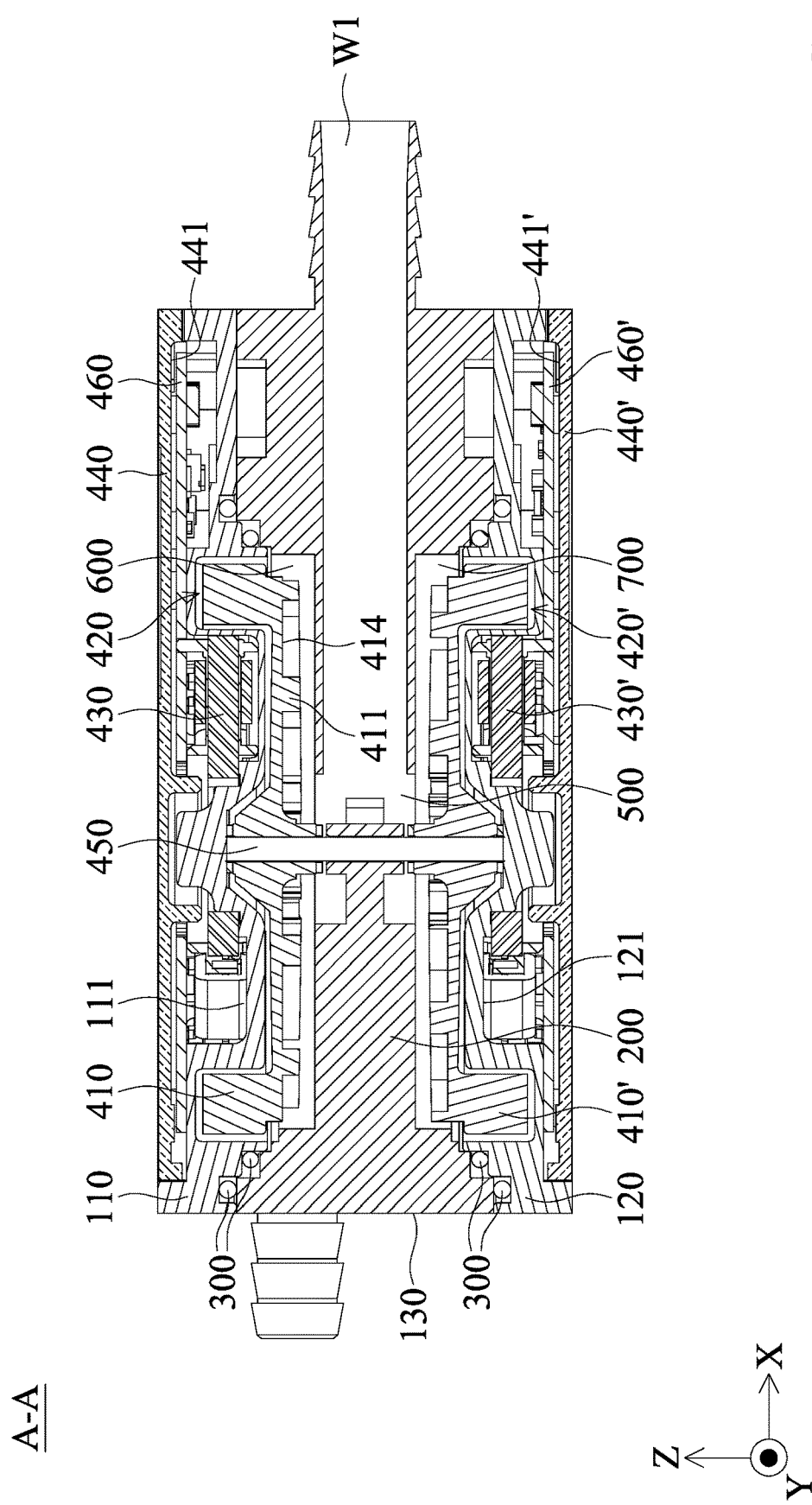
FIG. 7 is a schematic diagram of a pump mechanism according to another embodiment of the invention.

Referring to FIG. 7, in another embodiment of the invention, the first impeller 410 and the second impeller 410' are pivotally connected to the same shaft 450, so that they can be driven to rotate simultaneously relative to the housing 100. In this embodiment, one magnetic ring and one stator winding can be omitted to make assembly more convenient and reduce the cost of the members.

In summary, a pump mechanism is provided, including a housing, a first impeller, a second impeller, and two driving modules. The housing includes a first recess, a second recess, a plate, a channel, an input pipe, a first output pipe, and a second output pipe. The plate is disposed between the first recess and the second recess. The channel passes through the plate and communicated with the first recess and the second recess. The input pipe is connected to the channel and passes through the housing and the plate. The first output pipe and the second output pipe are respectively communicated with the first recess and the second recess. In the operation, the liquid enters the pump mechanism via the input pipe, and flow into the first recess and the second recess via the channel. Two driving modules can drive the first impeller and the second impeller to rotate, and the liquid in the first recess and the second recess can respectively leave the pump mechanism via the first output pipe and the second output pipe.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A pump mechanism, comprising:
a housing, comprising:
a first recess;
a second recess;
a plate, disposed between the first recess and the second recess;
a channel, passing through the plate and communicated with the first recess and the second recess;
an input pipe, connected to the channel and passing through the housing and the plate;
a first output pipe, communicated with the first recess; and
a second output pipe, communicated with the second recess;
a first impeller, disposed in the first recess;
a second impeller, disposed in the second recess; and
two driving modules, driving the first impeller and the second impeller respectively.

2. The pump mechanism as claimed in claim 1, wherein each of the driving modules has a stator winding and a circuit board.

3. The pump mechanism as claimed in claim 2, wherein the first impeller has a magnetic ring, and the second impeller has an additional magnetic ring.

4. The pump mechanism as claimed in claim 3, wherein the housing further comprises a first cover and a second cover.

5. The pump mechanism as claimed in claim 4, wherein the first cover is disposed between the first impeller and one of the driving modules.

6. The pump mechanism as claimed in claim 4, wherein the first cover has a depression portion, and the stator winding is disposed in the depression portion.

7. The pump mechanism as claimed in claim 4, wherein the first cover has an accommodating portion on its side, which is configured to accommodate an electronic component of the circuit board.

8. The pump mechanism as claimed in claim 1, wherein the first impeller and the second impeller are arranged in opposite directions.

9. The pump mechanism as claimed in claim 1, wherein the first impeller has a plurality of blades formed on a surface of the first impeller, and the surface faces the plate.

10. A pump system, comprising:
a pump mechanism, comprising:
a housing, comprising:
a first space;
a second space;
a plate, disposed between the first space and the second space;
a channel, passing through the plate and communicated with the first space and the second space;
an input pipe, connected to the channel and passing through the housing and the plate;
a first output pipe, communicated with the first space; and
a second output pipe, communicated with the second space;
a first impeller, disposed in the first space;
a second impeller, disposed in the second space; and
two driving modules, driving the first impeller and the second impeller respectively;
a first tube, connected to the first output pipe;
a second tube, connected to the second output pipe; and
a first electronic member, contacting the first tube.

11. The pump system as claimed in claim 10, wherein each of the driving modules has a stator winding and a circuit board.

12. The pump system as claimed in claim 11, wherein the first impeller has a magnetic ring, and the second impeller has an additional magnetic ring.

13. The pump system as claimed in claim 12, wherein the housing further comprises a first cover and a second cover.

14. The pump system as claimed in claim 13, wherein the first cover is disposed between the first impeller and one of the driving modules.

15. The pump system as claimed in claim 13, wherein the first cover has a depression portion, and the stator winding is disposed in the depression portion.

16. The pump system as claimed in claim 13, wherein the first cover has an accommodating portion on its side, which is configured to accommodate an electronic component of the circuit board.

17. The pump system as claimed in claim 10, wherein the first impeller and the second impeller are arranged in opposite directions.

18. The pump system as claimed in claim 10, wherein the first impeller has a plurality of blades formed on a surface of the first impeller, and the surface faces the plate.

* * * * *